United States Patent
Suevern

(10) Patent No.: US 11,232,045 B2
(45) Date of Patent: Jan. 25, 2022

(54) COMPUTER-IMPLEMENTED METHOD FOR INTEGRATING AT LEAST ONE SIGNAL VALUE INTO A VIRTUAL CONTROL UNIT

(71) Applicant: dSPACE digital signal processing and control engineering GmbH, Paderborn (DE)

(72) Inventor: Markus Suevern, Paderborn (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 0 days.

(21) Appl. No.: 17/109,785

(22) Filed: Dec. 2, 2020

(65) Prior Publication Data

US 2021/0165748 A1   Jun. 3, 2021

(30) Foreign Application Priority Data

Dec. 2, 2019 (EP) ...................................... 19212861

(51) Int. Cl.
| | |
|---|---|
| *G06F 13/10* | (2006.01) |
| *G06F 11/36* | (2006.01) |
| *G06F 3/0484* | (2013.01) |
| *G06F 13/38* | (2006.01) |
| *G06F 13/42* | (2006.01) |

(52) U.S. Cl.
CPC .......... *G06F 13/10* (2013.01); *G06F 11/3664* (2013.01); *G06F 13/382* (2013.01); *G06F 13/4282* (2013.01); *G06F 3/0484* (2013.01); *G06F 2213/0042* (2013.01)

(58) Field of Classification Search
CPC ..... G06F 11/3664; G06F 13/10; G06F 3/0484
See application file for complete search history.

(56) References Cited

U.S. PATENT DOCUMENTS

| | | | |
|---|---|---|---|
| 2017/0045865 A1* | 2/2017 | Naundorf ........... | G05B 19/0426 |
| 2020/0294414 A1* | 9/2020 | Sharma ................ | G09B 9/052 |
| 2021/0072720 A1* | 3/2021 | Castle ................ | G05B 19/0423 |

OTHER PUBLICATIONS

European Search Report for European Application No. 19212861.9 dated Apr. 8, 2020 with English translation.

(Continued)

*Primary Examiner* — Zachary K Huson
(74) *Attorney, Agent, or Firm* — Muncy, Geissler, Olds & Lowe, P.C.

(57) ABSTRACT

A computer-implemented method for integrating at least one signal value into a virtual control unit. The virtual control unit is executed on a simulation platform by means of a personal computer and requires at least one input signal, wherein at least one signal value can be assigned to the input signal. A simulation function provides at least one first simulated signal value to the virtual control unit. The microcontroller abstraction layer has a software component for integrating the first simulated signal value and a second external signal value into a virtual control unit, wherein the second external signal value is provided by an external peripheral device. A user makes a selection for the input signal via a user interface as to whether the software component is to use the first simulated signal value or the second external signal value.

16 Claims, 4 Drawing Sheets

(56) References Cited

OTHER PUBLICATIONS

ETAS Isolar-Eve YouTube Video Overview, at https://www.youtube.com/watch?v=APmDteeZfAA, p. 1 (Apr. 12, 2019).
ETAS Isolar-Eve User's Guide, at https://www.etas.com/download-center-files/products_ISOLAR-A/ISOLAR-EVEV3.3-UsersGuide.pdf, pp. 1-198 (Aug. 31, 2019).
Vector, "Virtual Developing and Testing AUTOSAR Software," at https://www.vector.com/de/de/events/global-de-en/webinar-recordings/2019/1561617/130-virtual-developing-and-testing-autosar-software, pp. 1-3 (Jun. 27, 2019).
Markus Deicke, "Virtual security of control device software with components dependent on hardware," Dissertation, Univeristy of Technology of Chemnitz, pp. 1-149 with English translation (2018).

* cited by examiner

COMPUTER-IMPLEMENTED METHOD FOR INTEGRATING AT LEAST ONE SIGNAL VALUE INTO A VIRTUAL CONTROL UNIT

This nonprovisional application claims priority under 35 U.S.C. § 119(a) to European Patent Application No. 19 212 861.9, which was filed on Dec. 2, 2019, and which is herein incorporated by reference.

BACKGROUND OF THE INVENTION

Field of the Invention

The present invention relates to a virtual control unit.

Description of the Background Art

Today, non-virtual control units, so-called real control units, are mostly understood to mean small computers with an input/output interface, which are often equipped with a real-time-capable operating system that allows the realization of—even complex—mostly control-technique related tasks on the control unit. The development of control units is a central component of the technical development of extensive device-related systems as they are known from industrial practice. Examples are the use of electronic control units in the automotive sector and in the aerospace industry.

The testing of the mass-produced control unit used in the end product is the end point of a multitude of upstream development steps of a regulation or control to be implemented on the control unit, wherein these development steps are usually described using the so-called V-model or V-cycle. Controller development, essential for the function of many technical systems, starts off with the mathematical modeling of the control algorithm on a computer with a mathematical and graphical modeling environment, wherein the controller should be considered part of the control unit. In addition, the environment of the control unit is also modeled mathematically, because the interaction of the controller on the control unit with the process to be controlled is of interest. A simulation in real time is generally not necessary in these functional mathematical considerations (offline simulation).

In the next step, the previously developed control algorithm is transferred by rapid control prototyping to a powerful, usually real-time-capable hardware that is connected to the actual physical process by suitable input/output interfaces, therefore, for example, to a motor vehicle engine. This real-time-capable hardware has generally nothing to do with the mass-produced control unit to be used later; at issue here is proof of the basic functionality of the previously developed control in practice.

In a further step, as part of automatic series code generation, the control is implemented on the target processor likely to actually be used later in the mass-produced control unit. Accordingly, in this step, the target hardware approximates the mass-produced control unit, but is not identical to the mass-produced control unit. In a further step, the mass-produced control unit, which normally is not available until a later development stage, is tested as part of a hardware-in-the-loop test (HIL test). The mass-produced control unit, physically available in this step, is connected here to a powerful simulator by means of its physical control unit interface. The simulator simulates the required variables of the mass-produced control unit under test and exchanges input and output variables with the mass-produced control unit. The pins of the physical control unit interface of the mass-produced control unit are connected to the simulator by a cable harness. In this way, it is possible to simulate in the simulation environment all required variables of a motor vehicle engine, if applicable the entire motor vehicle with the engine, drivetrain, chassis, and driving route, and to test the behavior of the mass-produced control unit in interaction with the simulation environment in a risk-free manner.

The HIL simulator emulates the electrical signals from sensors and actuators which are read by the control unit. Based on the incoming signals, by means of the control software the control unit in turn generates sensor and/or actuator control signals, which in turn lead to a change in the electrical signals in the HIL simulator. The electrical signals emulated by the HIL simulator are generated by means of an environment model that maps the required signals, therefore, the entire environment. In addition to the actual control path, the environment model also includes so-called disruptive models that affect the control loop, therefore, e.g., changing environmental conditions such as temperature, headwind, road unevenness, sensor signal errors such as electrical disturbances, and steering movements of the driver (model). The track that would be covered as a test track in a real driving test and thus would generate different electrical signals for the control unit is therefore mapped in the environment model within the HIL simulation. In order to perform a HIL test, however, the development of a control unit must already be relatively advanced, because the control unit is connected via its hardware to the HIL simulator.

The mass-produced control unit tested in this way in the context of the HIL simulation is ultimately installed in the "real" target system, therefore, for example, in a motor vehicle, and tested in the real physical environment that was previously only simulated in the simulation environment.

The development process outlined above for the controller development has proven extremely successful. However, this development process has the result that the mass-produced control unit is integrated into the development process not until the very end of development and is therefore also not checked until the late development stages. Before the mass-produced control unit is actually available, only functionalities can be tested with the development process shown on an abstract functional level, therefore, practically only on the level of the application software. A good part of the software components that will later be used on the mass-produced control unit is not co-tested in the early development stages. These software components include, for example, the runtime environment, which mediates between the application software and the hardware-oriented software layers. More greatly hardware-oriented software components are, for example, the operating system and platform-independent basic software (system services, communication services, I/O hardware abstraction layer, etc.) and finally the platform-dependent parts of the operating system and the basic software.

Hardware-independent software tests are required to enable earlier testing of the control software, for example, at a development time when no control unit hardware is yet available. Virtual control units, also known as V-ECUs, have become established for this purpose (see dSPACE Catalog 2019, pp. 52-53). A real control unit is emulated in a simulation scenario by means of a virtual control unit.

A virtual control unit does not yet contain the control unit hardware intended for it. It includes at least part of the control software of a real control unit and software modules for connecting the control software to a simulation platform.

Because the virtual control unit does not yet contain the control unit hardware intended for it, to test the control software, it must be implemented on different hardware or a processor. This is usually done on a personal computer. A personal computer is a computer for a single workplace or for private homes. It can be, for example, a desktop, notebook, or tablet computer and can run under any operating system such as, for example, Windows, iOS, or Unix.

In order to be able to execute a virtual control unit on a personal computer, a suitable simulation platform is required on which the virtual control unit is executed. A simulation platform is software that enables the execution of a virtual control unit and also offers a possibility of making signal values, required by the virtual control unit, available to the virtual control unit. The virtual control unit can access the hardware of the personal computer by means of the simulation platform.

An example of such a simulation platform is VEOS from dSPACE (see dSPACE Catalog 2019, pp. 118-123).

There are different gradations of how much control software of the virtual control unit already corresponds to the control software of the later real control unit. Thus, a virtual control unit can be created that contains only one or a few components that the later real control unit also contains, up to the almost complete control software of the later real control unit.

As a rule, the control software of a control unit is made up of several layers. Thus, there is usually an application layer, a runtime environment, a basic software layer (BSW layer), and a microcontroller abstraction layer.

Control software for automotive control units is often designed according to the AUTOSAR standard. AUTOSAR (AUTomotive Open System ARchitecture) is an open and standardized software architecture for electronic control units (ECUs), with the aim of using software in vehicles from different manufacturers and electronic components from different suppliers. The main concept of the AUTOSAR software architecture is the separation of hardware-independent application software, therefore the application layer and hardware-oriented basic software (BSW) using the runtime environment (abbreviated as RTE).

Such a software architecture through the separation makes it possible that a component-oriented, hardware-independent software structure at the application level can be developed without specific knowledge of the hardware used or planned.

The basic software (BSW) within the AUTOSAR software architecture has the following layers: service layer, ECU abstraction layer, and microcontroller abstraction layer (MCAL). The basic software is divided further into different basic software modules. The MCAL is the lowest layer of the basic software. In real control units, therefore control units with control unit hardware provided therefor, access to the microcontroller of the control unit is routed via the MCAL. The MCAL contains drivers with direct access to the internal peripheral devices of the real control unit microcontroller and supplies the other components of the basic software with the required values. The MCAL is a hardware-specific layer that ensures a standard interface to the basic software.

The MCAL must also ensure a standard interface to the basic software in the virtual control unit. However, because the control unit hardware associated with the control software cannot be accessed, the interfaces of the basic software must be operated by other software functions with the required input signals or associated signal values and the output signals of the control software or the associated signal values can be forwarded at interfaces with the environment of the virtual control unit.

The more the control software of a virtual control unit is developed, i.e., the closer it is to the control software to be ultimately installed in the real control unit, the more important it is that the interfaces of the basic software receive signal values as realistic as possible in the required test.

In order to create virtual control units that are as realistic as possible and to validate the software by reproducible tests, a virtual control unit can be created based on the control software of the real control unit. In this case, of course, some components of the control software of the real control unit have to be adapted to the virtual environment of the simulation platform.

For example, the microcontrollers of real control units are often connected to external peripheral devices such as, e.g., radio receivers, acceleration sensors, memory modules, gyroscopes, or other microcontrollers connected via an SPI bus (SPI=Serial Peripheral Interface). Peripheral devices are a functional extension of the microcontroller for the acquisition or outputting of physical and/or electrical parameters. The peripheral devices should be suitably simulated as well in a simulation with a virtual control unit.

The simulation of peripheral devices, in particular SPI peripheral devices, is particularly relevant when the basic software of the real control unit is to be tested as well and thus represents part of the virtual control unit.

In the case of SPI peripheral devices, however, there is the problem that they are sometimes very complex and a software reproduction for the simulation is very complex and therefore also prone to errors. So far, the integration of peripheral devices in the simulation with virtual control units has largely been dispensed with. Instead, in the state of the art, suitable hooks had to be provided in the control software, e.g., in order to inject sensor data from a simulation model into the virtual control unit. However, such hooks change the control software, so that it is not the actual control software that can be tested, but only the control software that has been adapted by hooks.

SUMMARY OF THE INVENTION

It is therefore an object of the present invention to develop the state of the art further.

According to an exemplary embodiment of the invention, a method is provided for integrating at least one signal value into a virtual control unit, wherein the virtual control unit has an application layer, a runtime environment, a basic software layer, and a microcontroller abstraction layer and the virtual control unit is executed on a simulation platform by means of a personal computer.

The virtual control unit requires at least one input signal. At least one signal value can be assigned to the input signal. Furthermore, a simulation function provides at least one first simulated signal value to the virtual control unit. The microcontroller abstraction layer of the virtual control unit has a software component for integrating the first simulated signal value and a second external signal value into a virtual control unit, wherein the second external signal value is provided by an external peripheral device. A user makes a selection for the input signal via a user interface as to whether the software component is to use the first simulated signal value or the second external signal value, wherein in a further method step, when the virtual control unit is executed, according to the user's selection, either the first simulated signal value or the second external signal value is made available to the virtual control unit as a signal value of the input signal.

As already described, the aim is to test whether the control software of a virtual control unit reacts correctly to every signal value of an input signal. Each input signal can assume different values, more precisely signal values. The virtual control unit should be provided with the most suitable signal values for testing the control software. Most suitable signal values in this case mean that the signal values are either as identical as possible to signal values that a real control unit receives or are precisely those signal values that can be used to test whether the virtual control unit reacts to the signal value as desired. For this, values in the marginal range of the possible signal values may also be necessary.

In order to obtain signal values that are as realistic as possible, these can either be made available as an external signal value from the peripheral device, which is later connected to the real control unit, or a signal value is simulated using a simulation function and is thus a simulated signal value.

Such a simulation function is a software function that calculates a signal value, optionally using an input parameter or multiple input parameters.

The calculation of the signal value in the simulation function can be, for example, a fixed signal value assignment, e.g., using a condition or table, or also a calculation using a calculation model. It is carried out, for example, in a simulation environment using the environment model or it can be integrated directly into the virtual control unit.

Because a simulation is fundamentally prone to errors, it is desirable to use signal values that are as real as possible from a peripheral device. The control software can be tested realistically especially if the external signal value is obtained from a real peripheral device that is later connected to the real control unit hardware, and test errors due to errors in the simulation can thus be avoided.

In order to test whether the virtual control unit also reacts correctly in the limit range or beyond the limit range of possible signal values, either the peripheral device must be able to supply such external signal values or it must be possible to generate these as simulated signal values using simulation.

It is known from the state of the art to provide at least one first simulated signal value to the virtual control unit by a simulation function. A simulated signal value is calculated, for example, by a mathematical simulation model. This is usually done using an environment model.

In addition to the actual control path, the environment model also includes so-called disruptive models that affect the control loop, therefore, e.g., changing environmental conditions such as temperature, headwind, road unevenness, sensor signal errors such as electrical disturbances, and steering movements of the driver (model). The track that would be covered as a test track in a real driving test and thus would generate different electrical signals for the control unit is therefore mapped in the environment model. Thus far, a virtual control unit in the computer for simulation is connected to various components, such as virtual sensors, actuators, and control unit networks. The virtual sensors, actuators, and/or control unit networks, therefore, the virtual hardware components, are integrated into the environment model as a hardware component model. For example, a virtual sensor is integrated as a sensor model into the environment model.

Instead of being implemented in the environment model outside of the virtual control unit, the simulation function can also be implemented within the virtual control unit, for example, as a virtual sensor in the microcontroller abstraction layer.

According to the invention, a second external signal value is provided to the virtual control unit. The second external signal value is provided by an external peripheral device. The external peripheral device thus fulfills its intended function and outputs at least one corresponding signal value via its interface.

Many peripheral devices provide their signal values to a real control unit via a serial peripheral interface, therefore, a so-called SPI-BUS. A personal computer usually has a USB interface (USB=Universal Serial Bus). The external peripheral device is connected to the personal computer by means of a USB-SPI adapter. A USB-SPI adapter can be used to directly access connected devices or modules with an SPI interface from a personal computer via USB with the simplest of commands, or conversely, a signal value can be received from the external peripheral device with an SPI interface in the personal computer.

In a preferred embodiment, the virtual control unit sends a message to the external peripheral device and the external peripheral device provides the second external signal value as a response to the message.

A message and a response to a message are, for example, in each case a bus communication according to a standardized data transfer protocol.

According to the invention, a software component in the microcontroller abstraction layer enables either the first simulated signal value or the second external signal value to be assigned to an input signal as a signal value.

A user makes a selection for at least one input signal or each input signal via a user interface as to whether the software component is to use the first simulated signal value or the second external signal value, wherein in a further method step, when the virtual control unit is executed, according to the user's selection, either the first simulated signal value or the second external signal value is used by the virtual control unit as a signal value of the input signal.

For example, the user sets a marker for each input signal in the user interface as to whether the external signal value or the simulated signal value is to be used for the input signal.

In another embodiment of the invention, either the external signal value is preselected for all input signals or the simulated signal value is preselected for all input signals and the user makes the specific selection of whether the external signal value or the simulated signal value is to be used by changing this setting for at least one specific input signal via the user interface.

If, for example, it is preselected that the external signal value is to be used for all input signals, thus the user according to the invention can change this setting via a user interface for at least one input signal and select that the signal value from a simulation function is to be used.

A user here is someone who wants to test the virtual control unit. A user interface enables the user to make settings on the virtual control unit or to run a test of the virtual control unit. This can be done via all known types of user interfaces, for example, configuration options via menu, mouse, gestures, or voice control.

The virtual control unit can be tested as realistically as possible by the invention. Thus, for example, all values from the external peripheral device can be used for test cases with signal values in the normal range, but signal values in the limit range can be made available to the virtual control unit by simulated signal values so that it can be tested how the virtual control units reacts to these signal values.

There are also external peripheral devices, such as, e.g., memory modules, whose communication with the control unit can be easily taken over, whereas other external peripheral devices, such as, e.g., an acceleration sensor, cannot deliver realistic values to a virtual control unit, because it does not experience any acceleration in the test situation, but presumably is constantly in one position. Here it is helpful in a test, e.g., to carry out the start communication, which establishes a connection between the acceleration sensor and the virtual control unit via a so-called handshake, with the real external signal values, but to make the actual acceleration values available to the virtual control unit via simulated signal values.

The invention relates further to a virtual control unit, wherein the virtual control unit has an application layer, a runtime environment (RTE), a basic software layer, and a microcontroller abstraction layer and can be executed on a simulation platform using a personal computer. Furthermore, the virtual control unit requires at least one input signal, wherein at least one signal value can be assigned to the input signal. The virtual control unit of the invention has at least one simulation interface in order to receive a first simulated signal value from a simulation function. Furthermore, the virtual control unit has at least one peripheral device interface to a second external signal value, wherein the second external signal value is provided by at least one external peripheral device. The peripheral device interface is a software interface here by means of which a hardware interface of the external peripheral device can be accessed. External peripheral devices often have an SPI interface, and they can thus communicate with other devices via an SPI bus (SPI stands for a Serial Peripheral Interface). In a preferred embodiment, the external peripheral device is connected to the personal computer via a USB-SPI adapter. The peripheral device interface of the virtual control unit then accesses, for example, signal values of the external peripheral device via USB, or can communicate with the external peripheral device via USB.

The microcontroller abstraction layer of the virtual control unit has a software component for integrating the first simulated signal value and/or the second external signal value into the virtual control unit. Furthermore, the virtual control unit has a user interface to the user through which the user can decide for each input signal whether the software component is to use the first simulated signal value or the second external signal value as the signal value for the input signal.

In a further embodiment, the software component of the virtual control unit is designed such that messages can be sent to the external peripheral device by means of the software component.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
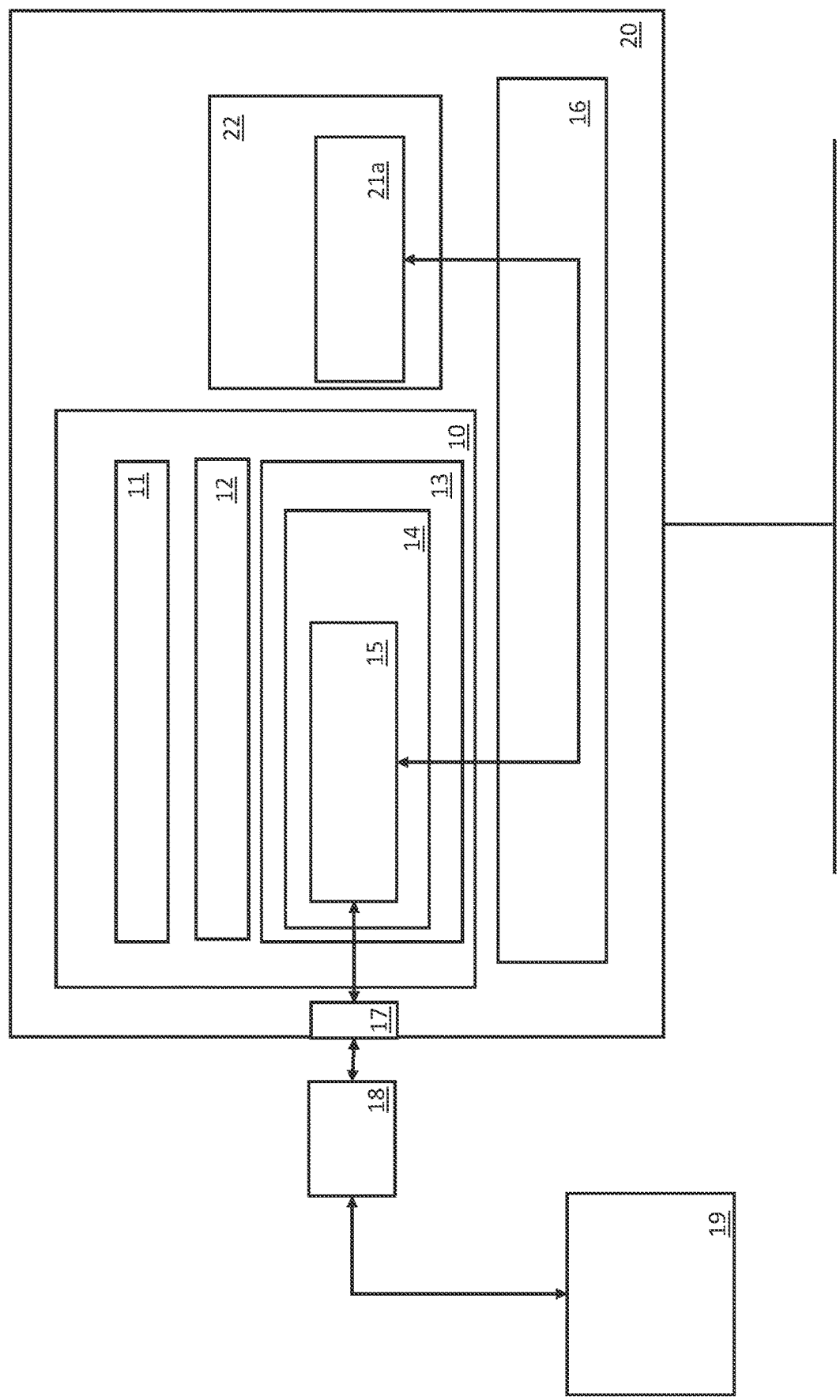
FIG. 1 shows an exemplary embodiment for a virtual control unit of the invention.

FIG. 1 shows an exemplary embodiment for a virtual control unit 10 of the invention. Control unit 10 contains multiple layers, such as application layer 11, runtime environment 12, and basic software layer 13. Basic software layer 13 in turn contains microcontroller abstraction layer 14. Software component 15, which can receive data from simulation function 21*a*, is located in microcontroller abstraction layer 14. In FIG. 1, simulation function 21*a* is located in environment model 22 and communicates with software component 15 via simulation platform 16 on which, in this example, both virtual control unit 10 and environment model 22 with simulation function 21*a* are executed.

Figure 2:
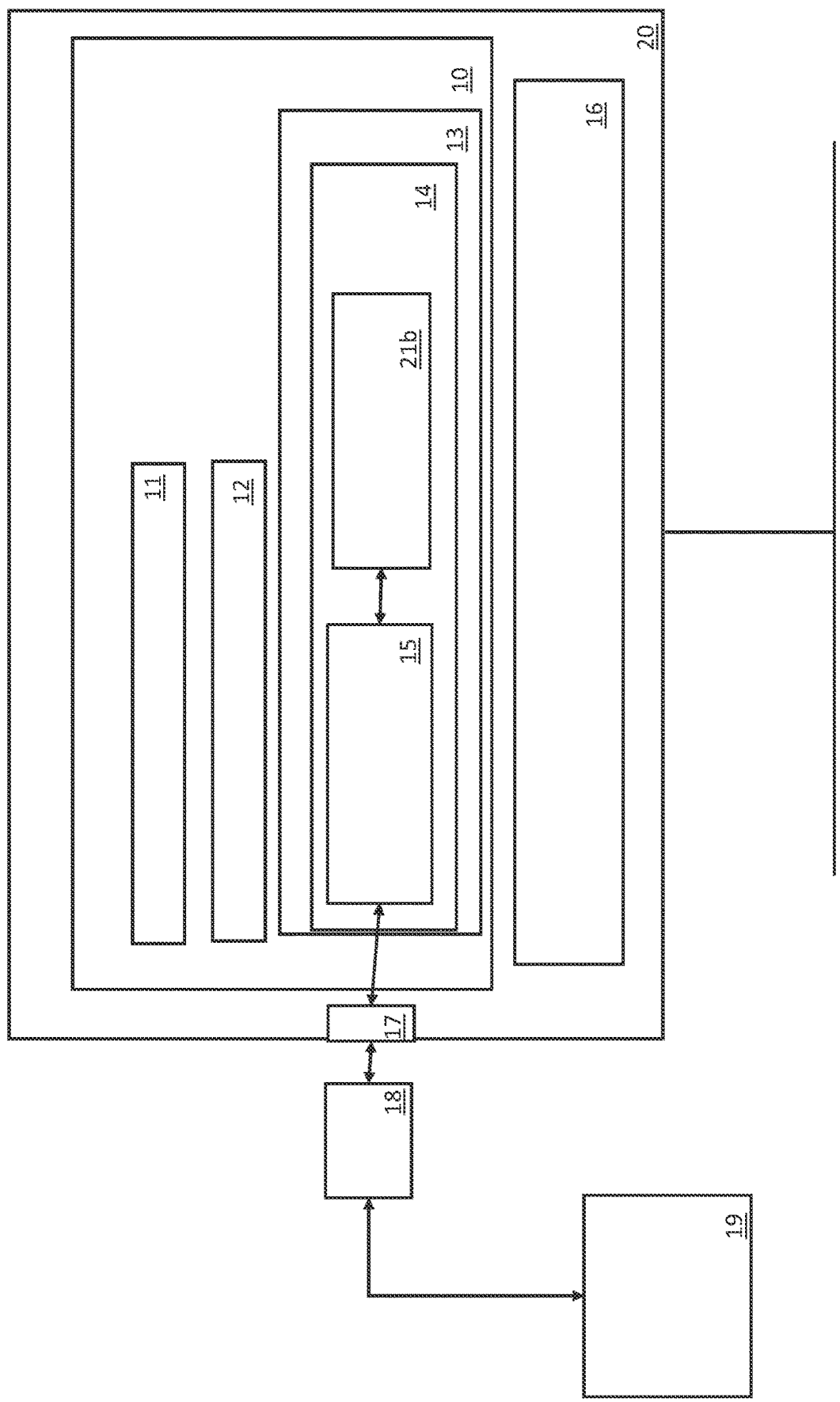
FIG. 2 shows an exemplary embodiment for a virtual control unit of the invention.

In contrast, FIG. 2 shows a further exemplary embodiment of a virtual control unit 10 in which simulation function 21*b* is located in microcontroller abstraction layer 14 and is thus executed by the execution of virtual control unit 10 on simulation platform 16. In this example in FIG. 2, the communication between software component 15 and simulation function 21*b* does not take place via simulation platform 16, but rather directly via corresponding software interfaces.

A further example, for simulation function 21 is a direct intervention in the SPI communication, as a result of which the simulated signal value is overwritten in accordance with a value fixedly predetermined by the user.

In both exemplary embodiments in FIG. 1 and FIG. 2, it is shown that software component 15 is connected to a USB-SPI adapter 18 via USB interface 17 of PC 20. This USB-SPI adapter 18 can convert the data, coming from external peripheral device 19 via SPI into adapter 18, into USB-compatible data and, conversely, put the data from virtual control unit 10 on an SPI bus and send them to external peripheral device 19.

Figure 3:
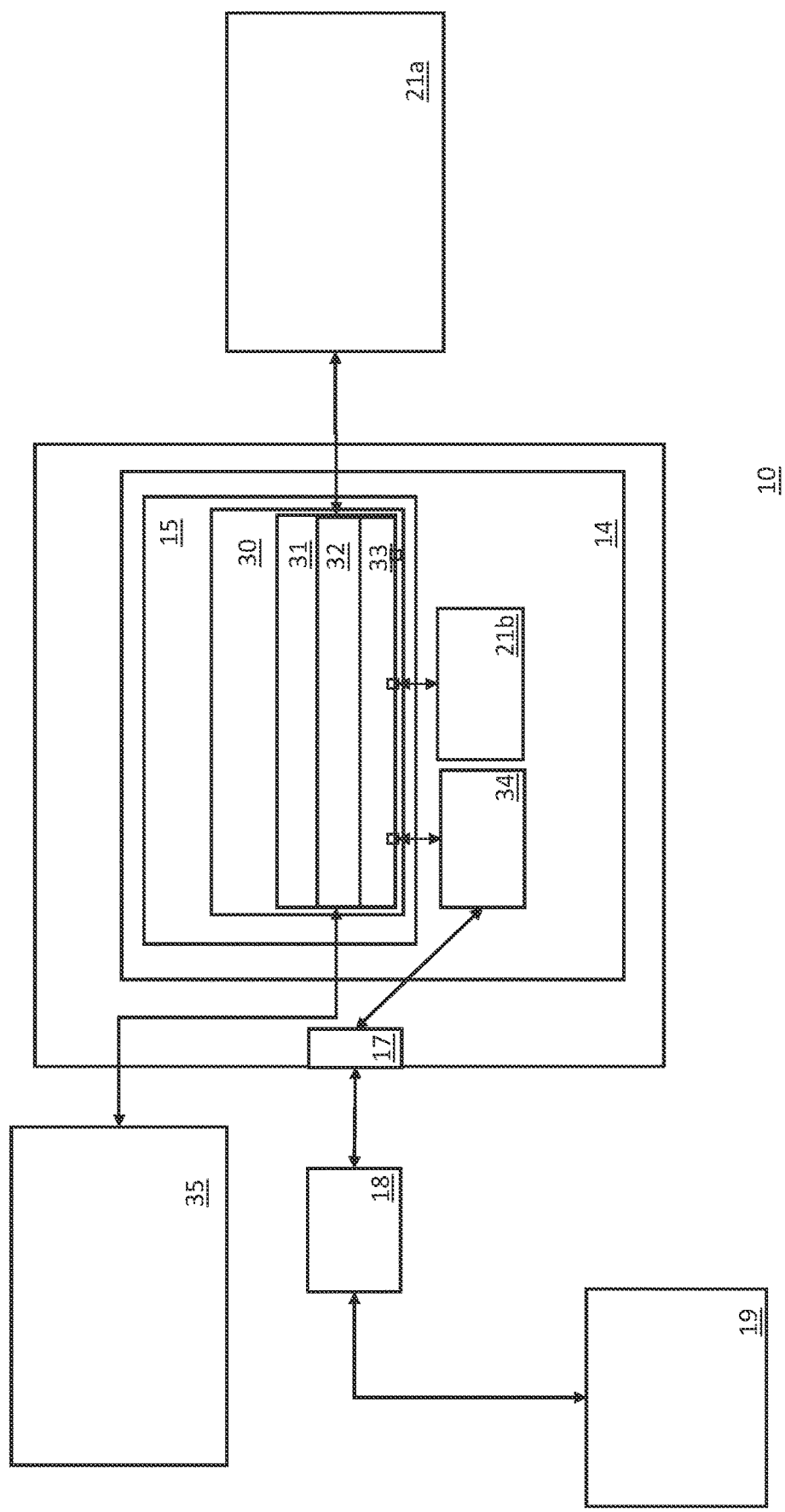
FIG. 3 shows an exemplary embodiment for a virtual control unit of the invention.

A detailed application example for software component 15 and its functions is shown in FIG. 3. In this example, software component 15 contains an SPI driver 30. SPI driver 30 contains an SPI driver interface 31, an access option 32 to the SPI communication, and an SPI device interface 33. SPI driver interface 31 is an AUTOSAR-compliant interface. Access option 32 is configured via a user interface 35. Such a configuration can take place by means of known configuration options, such as, e.g., textually or graphically.

The specific access option 32 is configured via user interface 35 by defining an intervention point with which the SPI communication can be influenced at the time of the simulation. This intervention point defines which content of the SPI message is to be modified and where the modified content is to come from.

In this way, e.g., expected SPI messages that have been specified by a user can be incorporated directly into the simulation without an SPI peripheral device 19 or a simulation function 21 being connected to the SPI bus. An example of this is a communication setup between external peripheral device 19 and virtual control unit 20. Even if external peripheral device 19 is not present, the SPI messages required by the peripheral device for the communication setup can be generated in advance and be made available to virtual control unit 10 via the configuration of the specific access option 32.

If interventions in the SPI communication are not sufficient for the simulation, then an external peripheral device 19 can be reproduced in the form of a simulation function 21. For example, software function 21 can be integrated into virtual control unit 10 as a simulation function 21a. In a preferred embodiment, software component 15 offers a corresponding interface 33 for this purpose.

Alternatively, simulation function 21a can be executed outside virtual control unit 10 in an environment model 22.

A major disadvantage with such an emulation of external peripheral device 19 is the at times very high implementation effort. In addition, a detailed description of the real hardware is required for the implementation, which is not available in every case. A software emulation is always appropriate if external peripheral device 19 is rather simple in design or else if a simplified behavior is sufficient for the simulation.

The integration of a real external SPI peripheral device 19 is always appropriate if an exact behavior of external peripheral device 19 is required for the simulation and appropriate hardware is available. For this case, the exemplary embodiment in FIG. 3 shows in microcontroller abstraction layer 14 a corresponding USB/SPI driver 34, which in combination with a USB/SPI adapter 18 connected to PC 20, enables access to a real SPI bus of external peripheral device 19.

Hybrid forms are also possible. Thus, some values can come from external peripheral device 19 and others from simulation function 21.

If, e.g., acceleration values from external peripheral device 19 are read into virtual control unit 10, but the values of simulation function 21 are actually to be used, then the values of the real external peripheral device 19 must be overwritten by the simulated values, for which the previously described access option 32 in the SPI communication is used.

The SPI communication is defined, for example, according to the AUTOSAR specification of an AUTOSAR SPI MCAL module for the connection of an external memory using so-called sequences, jobs, and channels. In this regard, a sequence can include multiple jobs and a job of multiple channels. For example, a write sequence comprises a first job and a second job, of which the first job is assigned to a channel that switches a memory module to the write mode. The second job can have, for example, two channels, a first channel that transmits the address to which the data are to be written and a second channel that transmits the data to be saved. Sequences for read access could have a similar structure.

SPI driver 30 offers corresponding functions for the execution of SPI sequences. If a write sequence is started via device interface 33, software component 15 then executes the associated functions and transmits the channels linked to the jobs. From the application point of view, a channel is a memory that can be written to before a sequence is started and can be read after the execution. The channels ultimately write the data that are transmitted between the microcontroller and an external SPI peripheral device.

Sequences are similar, e.g., in order to read out the current values of an acceleration sensor. The individual values are provided here by the external peripheral device 19 (sensor) in the form of register contents.

In the case of an acceleration sensor, the registers contain, for example, the current acceleration values for the X-, Y-, and Z-axes. For example, there is then a read sequence with two jobs. One job contains a channel with the register address to be read in the sensor. A further job comprises three channels with 16 bits each, one channel each for the acceleration values in the X-axis, Y-axis, and Z-axis.

In order to use values during a simulation of a simulation function 21, the AUTOSAR SPI MCAL module was further developed according to the invention and now includes a possibility for the user to intervene in the communication between virtual control unit 10 and external peripheral device 19. For this purpose, software component 15 contains, for example, one or more SPI access options 32 to the SPI communication. An SPI access option in this case refers to the data of an SPI channel, which can be manipulated within the scope of an SPI sequence or SPI job processing. For the configuration of access option 32, therefore, the SPI sequence, the SPI job, and the SPI channel as well as the direction, thus, input and output communication, must be specified.

An implementation for SPI driver 30 is then generated on the basis of the configuration, wherein interfaces are made available at which the values of the SPI bus manipulation can be tapped or applied in an environment model by connection to a simulation function 21, e.g., a simulation function 21a.

Figure 4:
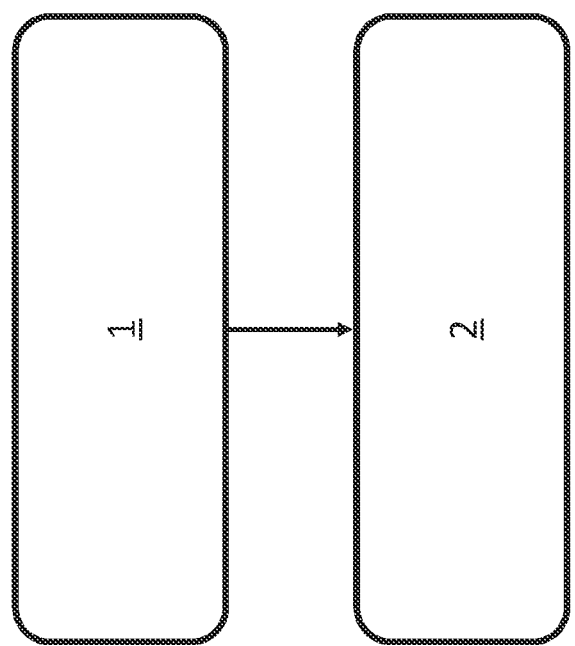
FIG. 4 shows an exemplary embodiment for a method of the invention.

FIG. 4 shows the method of the invention in an example. Thus, in a method step 1, a user configures an access option 32 via user interface 35 and in addition specifies whether an external signal value from an external peripheral device 19 is to be used or whether a simulated signal value from a simulation function 21 is to be used.

In a further method step 2, when virtual control unit 10 is executed, according to the configuration selected in method step 1, the external signal value of external peripheral device 19 or the simulated signal value of simulation function 21 is used as the signal value of the input signal.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A computer-implemented method for integrating at least one signal value into a virtual control unit, wherein the virtual control unit has an application layer, a runtime environment, a basic software layer, and a microcontroller abstraction layer, the virtual control unit including one or more software components of an engine control unit for a vehicle, the method comprising:
   executing the virtual control unit on a simulation platform on a personal computer;
   providing the virtual control unit with at least one input signal;
   executing a simulation function on the personal computer;
   providing, via a first interface at a software component of the virtual control unit, at least one first simulated signal value to the virtual control unit, the at least one first simulated signal value being generated by the simulation function, the first interface connecting the software component of the virtual control unit and the simulation function;

providing a second external signal value via a hardware interface of an external peripheral device;

selecting, by a user via a user interface, when the software component of the microcontroller abstraction layer of the virtual control unit uses the first simulated signal value or the second external signal value for the at least one input signal; and providing by the software component, according to the user's selection, the first simulated signal value or the second external signal value to the virtual control unit as a signal value of the at least one input signal when the virtual control unit is executed.

2. The computer-implemented method according to claim 1, wherein the virtual control unit sends a message to the external peripheral device and the external peripheral device provides the second external signal value as a response to the message, wherein the hardware interface of the external peripheral device and a second interface of the virtual control unit form a peripheral device interface for the exchange of the message and the second external signal value.

3. The computer-implemented method according to claim 1, wherein the external peripheral device is connected to the personal computer via a USB-SPI adapter, wherein at an SRI portion of the USB-SPI adapter, the USB-SPI adapter connects to the hardware interface of the external peripheral device, and wherein at an USB portion of the USB-SPI adapter at the personal computer, the USB portion communicates with a second interface of the virtual control unit.

4. The computer-implemented method according to claim 1, wherein the second external signal value of the external peripheral device is in a normal range for the external peripheral device, and wherein the first simulated signal value provided to the virtual control unit from the simulation function is in a limit range for the external peripheral device.

5. The computer-implemented method according to claim 1, wherein the simulation function communicates with the software component of the virtual control unit via the simulation platform.

6. The computer-implemented method according to claim 1, wherein the simulation function communicates with the software component of the virtual control unit within the microcontroller abstraction layer, the simulation function executing within the microcontroller abstraction layer.

7. The computer-implemented method according to claim 1, wherein the user interface defines an intervention point with which an SPI communication from the external peripheral device is influenced during simulation, wherein the intervention point defines which content of an SPI message of the SPI communication is modified during simulation and defines a source of a modification to the content of the SRI message.

8. The computer-implemented method according to claim 1, wherein the microcontroller abstraction layer includes hardware drivers and supplies other components of the basic software layer with values from the virtual control unit, wherein the microcontroller abstraction layer is a hardware-specific layer that provides a standard interface to the basic software layer.

9. A virtual control unit comprising:
at least one simulation interface adapted to receive a first simulated signal value;
at least one peripheral device interface;
an application layer;
a runtime environment;
a software component of an engine control unit of a vehicle;
a basic software layer; and
a microcontroller abstraction layer within the basic software layer, the software component operating within the microcontroller abstraction layer, wherein the virtual control unit is adapted to be executed on a simulation platform operating on a personal computer, wherein the virtual control unit requires at least one input signal, wherein at least one signal value is assigned to the input signal, wherein the virtual control unit has at least one simulation interface adapted to receive a first simulated signal value from a simulation function, wherein at least one second external signal value is transmitted to the virtual control unit via the peripheral device interface, wherein the second external signal value is provided by at least one external peripheral device, wherein the software component integrates the first simulated signal value and the second external signal value into the virtual control unit, and wherein the virtual control unit has a user interface for a user through which the user selects, for each input signal of the virtual control unit, when the software component integrates the first simulated signal value and the second external signal value as the signal value for each input signal.

10. The virtual control unit according to claim 9, wherein the external peripheral device is connected to the personal computer via a USB-SPI adapter, wherein at an SRI portion of the USB-SPI adapter, the USB-SPI adapter connects to a hardware interface of the external peripheral device, and wherein at an USB portion of the USB-SPI adapter at the personal computer, the USB portion communicates with the at least one peripheral device of the virtual control unit.

11. The virtual control unit according to claim 9, wherein the software component is designed such that messages from the virtual control unit are sent to the external peripheral device via the software component.

12. The virtual control unit according to claim 9, wherein the simulation function is executed in the microcontroller abstraction layer.

13. The virtual control unit according to claim 9, wherein the simulation function communicates with the software component of the virtual control unit via the simulation platform.

14. The virtual control unit according to claim 9, wherein, if the software component receives the at least one second external signal value, and if the user has selected the first simulated signal value for integration by the software component, then the at least one second external signal value is overwritten by the first simulated signal value.

15. The virtual control unit according to claim 9, wherein the user interface defines an intervention point with which an SPI communication from the at least one external peripheral device is influenced during simulation, wherein the intervention point defines which content of an SRI message of the SPI communication is modified during simulation and defines a source of a modification to the content of the SRI message.

16. The virtual control unit according to claim 9, wherein the microcontroller abstraction layer includes hardware drivers and supplies other components of the basic software layer with values from the virtual control unit, wherein the microcontroller abstraction layer is a hardware-specific layer that provides a standard interface to the basic software layer.

* * * * *